PHOTOSENSITIVE PREPOLYMER COMPOSITION AND METHOD

Original Filed Oct. 10, 1962

MICHAEL N. GIANGUALANO
IRVIN W. MARTENSON
LAWRENCE H. OTT
INVENTORS

BY [signature]

ATTORNEY

United States Patent Office 3,376,139

Patented Apr. 2, 1968

3,376,139

PHOTOSENSITIVE PREPOLYMER COMPOSITION AND METHOD

Michael N. Giangualano, now by judicial change of name Michael Nicholas Gilano, 1718 W. Chalet Ave., Anaheim, Calif. 92804; Irvin W. Martenson, 16615 Pequeno Place, Pacific Palisades, Calif. 90272; and Lawrence H. Ott, 1245 E. Altadena Drive, Altadena, Calif. 91001

Continuation of application Ser. No. 229,605, Oct. 10, 1962. This application Feb. 1, 1966, Ser. No. 539,236

12 Claims. (Cl. 96—35.1)

The present invention is a continuation of copending application entitled, Photosensitive Prepolymer Composition and Method, Ser. No. 229,605, filed in the name of the same inventors on Oct. 10, 1962, now abandoned.

The present invention relates to the photosensitization of prepolymer compositions, and more particularly to chemical compositions for making photographic relief images of particular use in the graphic arts, such as for printing plates, printed circuit boards, name plates, chemical milling, etc.

It is well known in the art of photo-mechanical reproduction how to utilize various materials such as bichromated shellac, polyvinyl alcohol, polyvinyl cinnamate, and related unsaturated polymers to form resist images upon various substrates or supports such as copper, copper-clad plastic sheets, aluminum, steel, brass, bronze, and othre metals; and also on glass and plastics.

Bichromated shellac, chromated polyvinyl alcohols, and chromated polyvinyl butyrals have limited shelf life, and the bichromate sensitizer must be stored in a separate container and mixed with the film-forming polymer just prior to use.

Polyvinyl cinnamate and related unsaturated ester polymers undergo film shrinkage during overexposure to actinic light, and, therefore, have certain limitations for fine-detail work.

There is a need for photosensitive compositions which are characterized by improved detail, better chemical resistance, long storage life, reproducibility from batch to batch, being preparable as a one-package system, and ease of removal after etching. There is also a need for photosensitive film compositions which do not appreciably shrink when exposed to actinic rays and which can be repeatedly washed and etched as required without adverse effects to the image detail or undercutting of the relief image.

It is an object of the present invention, therefore, to provide a novel photosensitive polymer resist.

It is another object of the present invention to provide a method for the photosensitization of prepolymers.

It is still another object of the present invention to provide a photosensitive composition which can be packaged in a single container with the required photo initiator and which has a long shelf life and exhibits unique chemical, physical, and electrical properties.

Another object of the present invention is to provide a photosensitive composition which can be easily removed by dipping in a solvent for several minutes and wiping it off.

Another object of the present invention is to provide a stable photosensitive composition which requires no blending, heating, or chemical treatment before use, which can be exposed to light rays over a wide spectral range, and which permits metals and other objects to be precoated and stored for long periods before and after exposure.

Another object of the present invention is to provide a superior stable light-sensitive composition which can be cross linked under the influence of actinic rays and which will form a durable coating having good heat resistance, low moisture absorption, and high resistance to acids, alkalis, and organic solvents.

According to one embodiment of the present invention, a prepolymer of an aryl allyl ester having two or more allyl groups is combined with an initiator or sensitizing agent and dissolved in a suitable solvent. The term "aryl allyl ester" is herein defined to include polynuclear allyl esters and aryl allyl ester copolymers, in addition to aryl allyl esters having only a single aryl group.

The sensitizing agent must be one that absorbs actinic radiation so as to dissociate into free radicals which accelerate complete polymerization of the prepolymer. The sensitizing agent can be ethers of benzoin, such as methyl, ether of benzoin; p,p′-substituted benzophenones such as 4,4′-bis(dimethylamine) benzophenone and 4,4′-bis(diethylamine) benzophenone; or bis 1-anthraquinonyl amino anthraquinones such as 1,4 bis(1-anthraquinoyl amino) anthraquinone and 1,5 bis(1-anthraquinonyl amino) anthraquinone, and combinations thereof. Other useful sensitizing agents include polynuclear quinones such as 1,2-benzanthraquinone and 2 methyl anthraquinone; mononuclear quinones such as 2,5-diphenyl-p-quinone; aromatic $\alpha$-diketones such as benzil; substituted aryl methylene dioxy compounds such as piperonal, piperoin, 3,4-methylene dioxychalcone, and 5,6-methylene dioxyhydrindone-1; substituted $\beta$-naphthoselenazolines such as 1-methyl-2-acetyl methylene-$\beta$-naphthoselenazoline; substituted $\beta$-benzothiazolines such as 3-methyl-2-benzoyl methylene benzothiazoline; substituted $\beta$-naphthothiazolines such as 1-methyl-2-menzoyl methylene-$\beta$-naphthothiazoline; anthrones such as anthrone; benzanthrones such as benz-2-ethylbenzanthrone and 7-H-benz(de)-anthracen-7-one; and azabenzanthrones such as 2-keto-3-methyl-1,3-diazabenzanthrone.

By the term prepolymer, as used herein, is meant an intermediate stage in the reaction of a thermosetting resin, which stage is similar to B-staged epoxy resins. That is, the prepolymer, which is soluble, is a monomer polymerized to partial completion. By combining the prepolymer of the present invention with a proper sensitizing agent, dissolving it in a suitable solvent, and eposing the combination to actinic radiation, the polymerization is completed to form a thermoset, irreversible, infusible, solid.

The features of the present invention which are believed to be novel are set forth with particularity in the appended claims. The present invention, both as to its organization and manner of operation, together with further objects and advantages thereof, may best be understood by reference to the following description, taken in connection with the accompanying drawings, in which:

Figure 1:
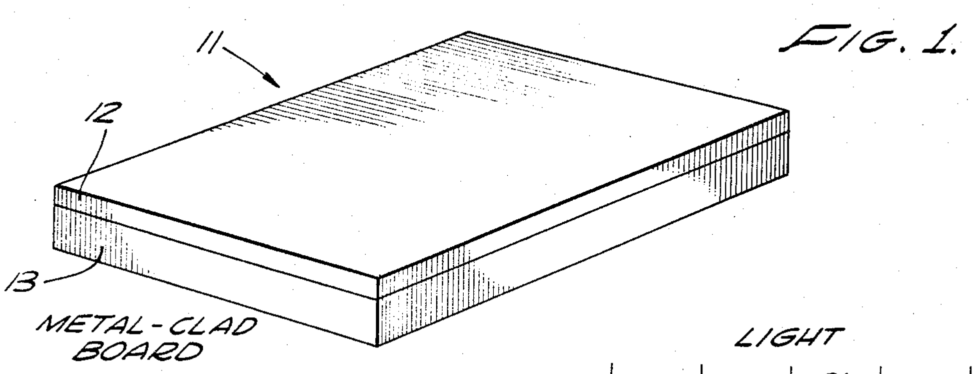
FIGURE 1 is an isometric view of a laminated metal-clad board.

The prepolymers of aryl diallyl esters can be prepared by controlled partial polymerization of the monomeric aryl diallyl ester. For example, the diallyl isophthalate liquid monomer is converted to the prepolymer by heating the liquid daillyl isophthalate in a suitable solvent such as xylene in the presence of a peroxide catalyst, and by not allowing the polymerization to proceed to completion. The polymerization is stopped when practically all the change in specific gravity has taken place, preferably to an iodine number of 56 to 58. The reaction is stopped at this point by cooling and the addition of a hydroquinone inhibitor. The prepolymer is then recovered from the solvent and is washed and dried. A white powdered resin is obtained which when dissolved in a suitable solvent yields a water-white solution.

The photosensitive resin composition can be a solid mixture of materials, as in a dried coating, or a solution of the materials in a suitable organic solvent or mixture of solvents. Good solvents for the sensitized aryl allyl prepolymers include:

(1) Esters such as isobutyl acetate, butyl "carbitol" acetate, amyl acetate, butyl "cellosolve" acetate, ethyl acetate, and methyl "cellosolve" acetate.

(2) Ketones such as acetophenone, diacetone alcohol, diisobutyl ketone, methyl isobutyl ketone, and isophorone.

(3) Glycol ethers such as ethylene glycol methyl ether, diethylene glycol methyl ether, and propylene glyco methyl ether.

(4) Aromatic solvents such as benzene, toluene, and xylene.

(5) Chlorinated solvents such as 1,1,1-trichlorethane, trichlorethylene, and methylene chloride.

The described prepolymer resin has the rare characteristic that its polymerization can be stopped at a determined point and it can be precipitated as a solid and stored for an indefinite period at ambient temperatures, and if desired, converted at any time into an infusible solid by employing peroxides and heat and pressure, or in accordance with this invention, by means of actinic radiation.

The resultant diallyl isophthalate prepolymer exhibits film-forming properties, excellent chemical resistance to both acids and alkalis, excellent moisture and heat resistance, and shows very little shrinkage when further cross-linked with actinic light. As a result of these properties, it is an ideal material for use as a resist in the manufacture of printed circuit boards and semiconductors, and in microchemical milling.

The light-sensitive polymeric composition, by being preshrunk before use, makes it possible to obtain accurate dimensional detail in printed circuits, chemical milling, etc., since a minimum shrinkage will occur during the further cross-linking of the aryl allyl ester prepolymer when it is exposed to actinic rays. This is because of the fact that the aryl allyl ester prepolymers have been previously processed to the point where practically all of the change in specific gravity has taken place, thereby assuring that very little shrinkage will occur during exposure to actinic radiation. This means that for fine detail work, the shrinkage does not have to be compensated for in the photographic negative.

Another advantage is the fact that the prepolymer can be dissolved in a suitable organic solvent along with the sensitizers considerably in advance of exposure, and will exhibit excellent shelf life under non-ideal conditions of temperature.

The prepolymers of aryl diallyl, aryl triallyl, aryl tetra allyl and polynuclear dialyl esters exhibit excellent light sensitivity and can be sensitized to increase their reactivity to actinic rays as much as 100 to 200 times. When sensitizer compounds are added to the prepolymeric aryl allyl esters, they exhibit exceptional stability, and therefore have long shelf life.

The concentration of sensitizer in the photo resist composition depends upon the amount of sensitive polymeric compound, i.e., the aryl allyl prepolymer, present. In the case of the prepolymer of diallyl isophthalate, from about 1 to 20%, preferably 1.5 percent by weight, of 1,4 bis(1-anthraquinoyl amino) anthraquinone can be used. Some sensitizers such as p,p' substituted benzophenones, e.g., 4,4'-bis(dimethylamino) benzophenone, in an amount less than 1.5%, cause a considerable increase in sensitivity to actinic light. The sensitizer is excited by the actinic radiation, and, in turn, speeds up the polymerization. This is accomplished by the sensitizer being dissociated into free radicals by the actinic radiation or energy that it absorbs. The free radicals initiate the polymerization of the prepolymer.

The present invention will be more readily understood from a consideration of the following specific examples, which are given for the purpose of illustration only, and are not intended to limit the scope of the invention in any way:

Example I

A typical resist formulation useful for making relief images on copper plates or printing plates is prepared as follows:

| | Grams |
|---|---|
| Diallyl isophthalate prepolymer | 1.5 |
| Methyl isobutyl ketone | 2.5 |
| Cellosolve acetate | 2.5 |
| Methyl ether of benzoin | 0.24 |

The materials are mixed together employing slight heat until all parts are dissolved. The solution is then filtered, after which it is ready for use. For this photosensitive resist composition it is preferred to use xylene as a developer, although ketones such as methyl ethyl ketone, or chlorinated solvents such as trichlorethylene can be used.

Example II 2.4 grams of a prepolymer of an aryl allyl ester, such as diallyl isophthalate, the preparation of which has been described herein, is dissolved in a mixture of 5.0 grams of methyl isobutyl ketone and 5.0 grams of cellosolve acetate with slight heat and agitation. Then 0.10 gram of benzil and 0.01 gram of p,p'-dimethyl amino benzophenone is added directly to the solvent resin solution and mixed until dissolved. After filtering, the composition is ready for use.

No special order of dissolving the materials is required, and when the solution is obtained and filtered, it is ready for use.

Example III

| | Grams |
|---|---|
| Diallyl isophthalate prepolymer | 1.5 |
| Methyl isobutyl ketone | 5.0 |
| 4,4' bis(dimethylamino) benzophenone | 0.01 |

Example IV

| | Grams |
|---|---|
| Triallyl trimellitate prepolymer | 1.5 |
| Cellosolve acetate | 5.0 |
| 4,4' bis(dimethylamino) benzophenone | 0.01 |

Example V

| | Grams |
|---|---|
| Tetra allyl pyromellitate prepolymer | 1.5 |
| Xylene | 2.5 |
| Isopropylacetate | 2.5 |
| 4,4' bis(dimethylamine) benzophenone | 0.01 |

The aryl allyl prepolymers are interchangeable in the photo resist composition and can be sensitized by the same initiators. For the sake of further examples of sensitizers, diallyl isophthalate will be used, but it is not intended to restrict the mentioned sensitizers to the prepolymers of diallyl isophthalate.

Example VI

| | Grams |
|---|---|
| Diallyl isophthalate prepolymer | 1.5 |
| Methyl cellosolve acetate | 2.5 |
| Toluene | 2.5 |
| Benzil | 0.1 |

Example VII

| | Grams |
|---|---|
| Diallyl isophthalate prepolymer | 1.5 |
| Methyl cellosolve acetate | 2.5 |
| Toluene | 2.5 |
| Methyl ether of benzoin | 0.25 |

Example VIII

| | Grams |
|---|---|
| Diallyl isophthalate prepolymer | 1.5 |
| Methyl isobutyl ketone | 5.0 |
| 1,2-benzanthraquinone | 0.05 |

Example IX

| | Grams |
|---|---|
| Diallyl isophthalate prepolymer | 1.5 |
| Cellosolve acetate | 2.0 |
| Diacetone alcohol | 3.0 |
| 2-methyl anthraquinone | 0.2 |

Example X

| | Grams |
|---|---|
| Diallyl isophthalate prepolymer | 1.5 |
| Methyl isobutyl ketone | 2.0 |
| Cellosolve acetate | 2.0 |
| Toluene | 1.0 |
| Piperonal | 0.15 |

Example XI

| | Grams |
|---|---|
| Diallyl isophthalate preploymer | 1.5 |
| Methyl isobutyl ketone | 2.0 |
| Xylene | 2.0 |
| Cellosolve acetate | 1.0 |
| 2-keto-3-methyl-1, 3-diazabenzanthrone | 0.05 |

Example XII

| | Grams |
|---|---|
| Diallyl isophthalate prepolymer | 1.5 |
| Methyl isobutyl ketone | 2.0 |
| Xylene | 2.0 |
| Cellosolve acetate | 1.0 |
| 1-methyl-2-benzoyl methylene-$\beta$-naphthothiazoline | 0.05 |

The probable structure of the recurring units of the prepolymers of aryl allyl esters can be better understood from the following examples:

(1) Prepolymer of diallyl isophthalate

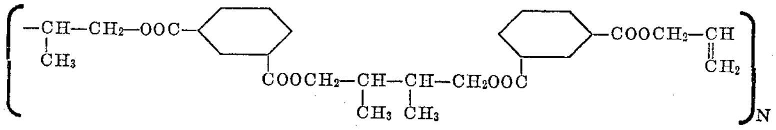

(2) Prepolymer of triallyl trimellitate

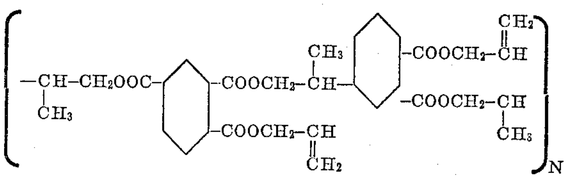

(3) Prepolymer of tetra-allyl pyromellitate

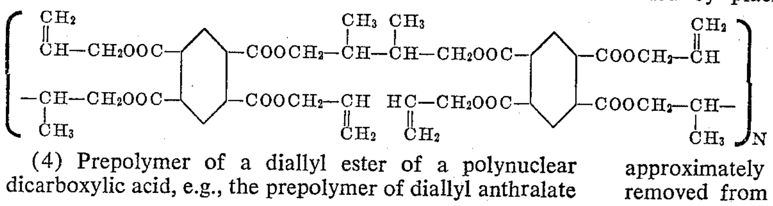

(4) Prepolymer of a diallyl ester of a polynuclear dicarboxylic acid, e.g., the prepolymer of diallyl anthralate

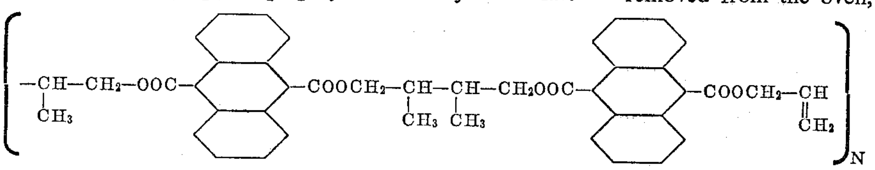

The method of preparing a support plate with a photopolymerizable coating composition includes the following steps: the photosensitive material is applied to the support plate by dipping, spraying, or roller coating. The wet coated plate is commonly drained or whirled to obtain a uniform film thickness. After drying at room or slightly elevated temperature in subdued light, the plate is placed in intimate contact with a photographic negative and exposed to actinic light. Useful light sources are mercury vapor lamps or high-ampere white-flame arcs. Exposure times vary from a fraction of a minute to several minutes at a distance of 2 to 3 feet, respectively. The exposed plate is then developed by immersion in an organic solvent such as methyl ethyl ketone or 1,1,1-trichlorethane for less than a minute at room temperature. During development the organic solvent dissolves the unexposed areas of thes coating and allows the exposed areas to remain intact on the support plate. The transparent image on the photographic negative is thus accurately reproduced as a resist image on the support plate.

After development, an optional step is to dye the resist image, which is normally transparent and colorless and difficult to see, by immersion for less than a minute in a dye bath comprising a synthetic dye in a compatible organic solvent. Finally, the plate is washed in flowing water and dried.

If etching of the metal base areas not protected by the resist image is desired, the plate is immersed in a suitable acid or alkali. Ferric chloride and ammonium persulfate are common etchants for copper; sodium hydroxide is used for aluminum, as is also electrolytic etching in dilute hydrochloric acid. In other processes the resist image serves as an intermediate step for electroplating and evaporative-film operations, or as an opaque film for images on transparent objects as signs, or to produce decorative effects. In photo milling, which is a relatively new method for making small accurate metal parts of thin metal sheet, the resist image is applied to both sides of the sheet in accurate register. The metal etchant is then applied to both sides to remove unwanted metal.

Turning now to the drawings, which illustrate the use of the described photosensitive resist composition in a process for making printed circuit boards, FIGURE 1 shows a board 11 having a covering layer 12 of 0.0014 inch thick copper sheet laminated to a 0.060 inch thick phenolic composition base 13, such as is commonly used in the printed circuit industry. Board 11 should be scrubbed with an abrasive cleaner and dried.

Figure 2:
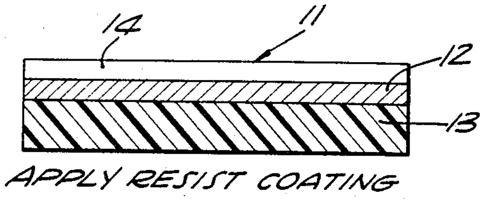
FIGURES 2–6 are sectional views taken through the board of FIGURE 1, and showing successive steps in the use of the photosensitive resist composition according to the present invention.

FIGURE 2 is a sectional view showing board 11 after the described photosensitive resist composition is applied as by flowing onto the surface of copper layer 12 to form layer 14. The excess resist can be drained by holding the board vertically for several minutes. The coating is then dried by placing board 11 in an oven maintained at approximately 150° F. for 10 minutes. The coating, when removed from the oven, is smooth, glossy, and hard.

Figure 3:
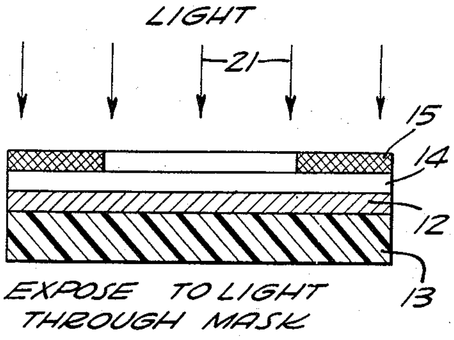

FIGURE 3 shows how mask 15, which can be a photographic negative of an electrical circuit, is placed in contact with the photosensitive layer 14. The combination is then put into the vacuum frame of a printing machine and exposed for one to three minutes to a 35-ampere white-flame arc light source about 2 feet away, represented by arrows 21. Light of from 3200–4100 angstrom units is very satisfactory. After exposure, the board is removed and the coating developed by placing the board vertically in a tank of methyl ethyl ketone for approximately 30 seconds. The board is then removed and immersed for 30 seconds in a second tank containing a solution of dye in organic solvent to render the normally-transparent resist image visible.

Figure 4:
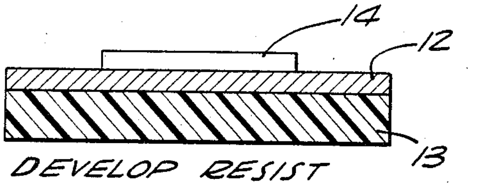

FIGURE 4 shows the board after it is rinsed in flowing water to remove adhering dissolved resist solution and excess dye and finally dried by slightly warming it.

The board at this stage is ready for etching and his on the copper surface the image of the electrical circuit, this image being comprised of a film of dry, hard, polymerized resist. The surface area other than that covered by the resist image is bare copper.

Figure 5:
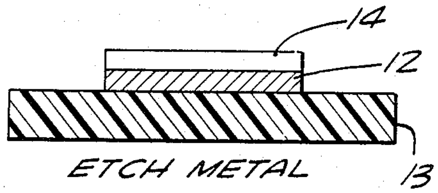

FIGURE 5 shows the board after the bare copper is removed by a suitable acid-type etchant. The board can be placed in a spray-type etching machine, of a kind commonly used in the industry, which sprays a solution of ferric chloride on the surface. The concentration of the ferric chloride, commonly stated in terms of specific gravity, can be 38 degrees Baumé. Within several minutes the bare unprotected copper on the board surface will be completely etched away. The board is then removed and thoroughly rinsed to remove all traces of ferric chloride, and then dried.

Figure 6:
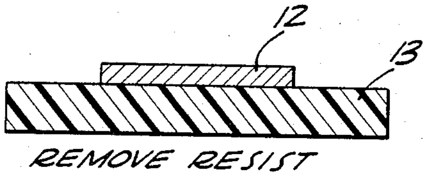

FIGURE 6 shows the board after it is immersed in a solvent such as trichlorethylene or methyl ethyl ketone to soften the resist image, which can be removed by scrubbing with a mild abrasive cleaner, revealing the bright-copper electrical circuit. The finished circuit board can be rinsed in hot water and dried.

There has thus been described how certain polymeric material compositions and elements embodying a prepolymer of aryl allyl esters, and which exhibit some light sensitivity, such as prepolymers of aryl triallyl esters, prepolymers of aryl tetra allyl esters, and prepolymers of polynuclear diallyl and triallyl esters, and in particular the prepolymers of iso and para aryl diallyl esters, such as prepolymers of diallyl isophthalate, and the prepolymers of diallyl terephthalate, and certain sensitizers which increases the light sensitivity of this class of compounds, can be used in the manufacture of printed-circuit boards.

While particular embodiments of the present invention have been shown and described, it will be obvious to those skilled in the art that changes and modifications may be made without departing from this invention in its broader aspects, and therefore, the aim in the appended claims is to cover all such changes and modifications as fall within the true spirit and scope of this invention.

We claim:

1. A photosensitive resist composition consisting essentially of:

(a) a prepolymer of an aryl allyl ester having more than one allyl group, said prepolymer being a solvent-soluble material which is a solid at ambient temperature, and which undergoes very little shrinkage when further cross-linked by actinic radiation, and (b) a photopolymerization sensitiving agent which, upon absorbing actinic radiation at room temperature accelerates polymerization of said prepolymer.

2. A composition as defined in claim 1 in which said prepolymer has been recovered from the reaction mixture produced by polymerization of monomer.

3. A composition as defined in claim 1 in which said prepolymer has been recovered from the reaction mixture produced by partial polymerization of monomer from which said prepolymer has been prepared.

4. A composition as defined in claim 1 in which said prepolymer has been separated from the reaction mixture produced by polymerization of monomer from which said prepolymer has been prepared.

5. A composition as defined in claim 1 in which said prepolymer has been precipitated from the reaction mixture produced by polymerization of monomer from which said prepolymer has been prepared.

6. A composition as defined in claim 2 in which said sensitizing agent is selected from the group consisting of ethers of benzoin, p,p′ substituted benzophenones, bis 1-anthraquinonyl amino anthraquinones, polynuclear quinones, mononuclear quinones, aromatic α-diketones, substituted aryl methylene dioxy compounds, substituted β-naphthoselenazolines, substituted β-benzothiazolines, substituted β-naphthothiazolines, anthrones, benzanthrones, and azabenzathrones.

7. A composition as defined in claim 2 in which said sensitizing agent is selected from the group consisting of methyl ether of benzoin, 4,4′ bis(dimethylamino)benzophenone, 4,4′ bis(diethylamino)benzophenone, 1,4 bis(1-anthraquinoyl amino) anthraquinone, 1,4, bis(1-anthraquinoyl amino) anthraquinone, 1,2 benzanthraquinone, 2 methyl anthraquinone, 2,5-diphenyl-p-quinone, benzil, piperonal, 3,4-methylene dioxychalcone, 5,6-methylene dioxhydrindone-1, piperoin, 1-methyl-2-acetyl methylene-β-naphthoselenazoline, 3-methyl-2-benzoyl methylene benzothiozoline, 1-methyl-2-benzoyl methylene-β-naphthothiazoline, anthrone, benz-2-ethylbenzanthrone, 7-H-benz-(de)-anthracen-7-one, and 2-keto-3-methyl-1,3-diazabenzanthrone.

8. A composition as defined in claim 2 in which said prepolymer is selected from the group consisting of aryl diallyl esters, aryl triallyl esters, aryl tetra allyl esters, polynuclear polyallyl esters, and aryl polyallyl ester copolymers.

9. A composition as defined in claim 2 in which said prepolymer is selected from the group consisting of diallyl isophthalate, diallyl terephthalate, diallyl anthralate, triallyl trimellitate and tetra allyl pyromellitate.

10. A composition as defined in claim 2 in which said prepolymer is diallyl isophthalate.

11. A method of photographically printing an image upon a surface, consisting essentially of the steps of:

(a) applying to said surface a photopolymerizable layer comprising a photopolymerization sensitizing agent and a prepolymer selected from the group consisting of aryl diallyl esters, aryl triallyl esters, aryl tetra allyl esters, polynuclear polyallyl esters, and aryl polyallyl ester copolymers, said prepolymer being capable of polymerizing to completion by photoinitiated polymerization in the presence of said sensitizing agent which is activatable by actinic radiation, said prepolymer being a solvent-soluble material which is a solid at ambient temperature, has been recovered from the reaction mixture produced by polymerization of monomer and undergoes very little shrinkage when further cross-linked by actinic radiation, (b) drying said layer, (c) photopolymerizing said layer with said actinic radiation through an image-bearing transparency placed in contact with said layer and having substantially opaque and substantially transparent areas, until substantially complete polymerization of said prepolymer occurs throughout the entire thickness of said layer in the areas thereof corresponding to said substantially transparent area, whereby said layer in said corresponding areas is converted to the thermoset, irreversible, infusible, solid state, but without any substantial polymerization in the areas of said layer corresponding to said substantially opaque areas, and (d) removing said layer in the latter corresponding areas.

12. Photosensitive photographic means including a support surface having thereon a dry photopolymerizable layer consisting essentially of:

(a) a photopolymerization sensitizing agent which is activatable by actinic radiation, and (b) a prepolymer of an aryl allyl ester having more than one allyl group, said prepolymer being capable of polymerizing to completion by photoinitiated polymerization in the presence of said sensitizing agent, and being a solvent-soluble material which is a solid at ambient temperature, has been recovered from the reaction mixture produced by polymerization of monomer and undergoes very little shrinkage when further cross-linked by actinic radiation.

References Cited

UNITED STATES PATENTS

| | | | |
|---|---|---|---|
| 2,339,058 | 1/1944 | De'Alelio ---------- | 260—78.4 |
| 2,722,512 | 11/1955 | Crandall. | |
| 2,791,504 | 5/1957 | Plambeck. | |
| 2,832,758 | 4/1958 | Heiburger et al. ---- | 260—78.4 |
| 3,030,341 | 4/1962 | Willard ------------ | 260—78.4 |
| 3,036,915 | 5/1962 | Notley ---------- | 96—115 XR |
| 3,060,025 | 10/1962 | Burg et al. ------- | 96—116 XR |

OTHER REFERENCES

Nichols, F. S. and Flowers, R.G.k Ind. & Eng. Chem., 42, 1950, pages 292–295.

J. TRAVIS BROWN, *Acting Primary Examiner.*

NORMAN G. TORCHIN, *Examiner.*

R. SMITH, *Assistant Examiner.*